(12) United States Patent
Cao et al.

(10) Patent No.: US 11,729,527 B2
(45) Date of Patent: Aug. 15, 2023

(54) PHOTOSENSITIVE ARRAY AND IMAGING APPARATUS HAVING THE SAME

(71) Applicant: WUHAN XINXIN SEMICONDUCTOR MANUFACTURING CO., LTD., Hubei (CN)

(72) Inventors: Kaiwei Cao, Hubei (CN); Peng Sun, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 29 days.

(21) Appl. No.: 17/566,180

(22) Filed: Dec. 30, 2021

(65) Prior Publication Data

US 2022/0385845 A1 Dec. 1, 2022

(30) Foreign Application Priority Data

May 31, 2021 (CN) .......................... 202110601254.9

(51) Int. Cl.
*H04N 25/75* (2023.01)
*H01L 27/146* (2006.01)
(52) U.S. Cl.
CPC ......... *H04N 25/75* (2023.01); *H01L 27/1461* (2013.01); *H01L 27/1463* (2013.01); *H01L 27/14612* (2013.01)
(58) Field of Classification Search
CPC ................ H04N 25/75; H01L 27/1461; H01L 27/14612; H01L 27/1463; H01L 27/14603; H01L 27/14609; H01L 27/14632; H01L 27/14643; H01L 27/14687; H01L 27/14812; H01L 27/14868
See application file for complete search history.

(56) References Cited

U.S. PATENT DOCUMENTS 6,933,998 B1 * 8/2005 Iwahashi ........... G02F 1/136277
349/146
9,923,023 B2 * 3/2018 Ishino ................. H01L 27/1462
10,229,620 B2 * 3/2019 Jeon .................. G02F 1/134336
(Continued)

FOREIGN PATENT DOCUMENTS

CN 102938409 A 2/2013

*Primary Examiner* — Shahbaz Nazrul
(74) *Attorney, Agent, or Firm* — Muncy, Geissler, Olds & Lowe, P.C.

(57) ABSTRACT

The present invention relates to a photosensitive array and an imaging apparatus incorporating the photosensitive array. Each pixel region in the photosensitive array corresponds to a substrate tap region, and the substrate of the pixel region continues with the substrate of the corresponding substrate tap region. The substrate tap region provides a voltage application location for the substrate of the corresponding pixel region. Multiple columns of pixel regions include sets of two adjacent columns, in each of which sets, charge readout regions of each column directly face charge readout regions of the other column while photosensitive regions of each column are separated from photosensitive regions of the other column by the charge readout regions, and each of which sets includes subsets of four pixel regions belonging to two adjacent rows and surrounding a corresponding substrate tap region.

16 Claims, 6 Drawing Sheets

(56) References Cited

U.S. PATENT DOCUMENTS

| | | | |
|---|---|---|---|
| 11,244,978 B2* | 2/2022 | Ogawa | H01L 27/14623 |
| 2011/0174957 A1* | 7/2011 | Okada | H01L 27/14603 |
| | | | 250/208.1 |
| 2017/0171488 A1* | 6/2017 | Oike | H04N 25/709 |
| 2019/0288021 A1* | 9/2019 | Koyanagi | H01L 27/14641 |
| 2019/0371839 A1* | 12/2019 | Sato | H01L 27/14638 |
| 2021/0382516 A1* | 12/2021 | Yan | G06E 3/005 |
| 2022/0246650 A1* | 8/2022 | Jang | G01S 17/894 |

* cited by examiner

PHOTOSENSITIVE ARRAY AND IMAGING APPARATUS HAVING THE SAME

CROSS-REFERENCE TO RELATED APPLICATION

This application claims the priority of Chinese patent application number 202110601254.9, filed on May 31, 2021, the entire contents of which are incorporated herein by reference.

TECHNICAL FIELD

The present invention relates to the technical field of photosensitive technology and, more particularly, to a photosensitive array and an imaging apparatus having the same.

BACKGROUND

Existing photosensitive techniques are mainly used in charge-coupled device (CCD) and complementary metal-oxide-semiconductor (CMOS), which work in different ways. CMOS is advantageous over CCD in faster imaging, better system integration performance and lower power consumption. However, pixels in photosensitive arrays of conventional CMOS-implemented image sensors usually each include at least one photosensitive diode and three to six transistors, leading to a relatively small proportion of a sensor's effective photosensitive region. With the development of technology, it becomes increasingly urgent to increase the number of pixels per unit area, leading to increasing shrinkage of each pixel's area. CMOS pixels with a smaller area may have a reduced full-well charge capacity, which may lead to reduced sensitivity and a reduced dynamic range of the photosensitive array consisting of the CMOS pixels.

Chinese Pat. Pub. No. CN102938409A discloses a photosensitive detector based on two MOSFETs with composite dielectric gates. In this photosensitive detector, each pixel includes a photosensitive transistor configured mainly for light sensing (all referred to as a MOS capacitor) and a readout transistor for reading out the number of photoinduced charge carriers. The MOS capacitor and the readout transistor are formed in different substrate regions which are separated from each other by a shallow trench isolation (STI), and each of them includes, stacked over the substrate from the bottom upward, a bottom insulating dielectric layer, a photoelectron storage layer, a top insulating dielectric layer and a control gate. In addition, source/drain regions are formed in the substrate on one side of the readout transistor. The MOS capacitor and the readout transistor are connected to each other at their photoelectron storage layers, and the readout transistor is controlled to read out the number of photoinduced charge carriers that cross from the substrate portion on the side of the MOS capacitor into the photoelectron storage layer during exposure to light. The fabrication of this photosensitive detector is compatible with the existing integrated circuit processes and, compared with the CCD and CMOS techniques, provides a higher signal-to-noise ratio and a greater full-well charge capacitor with same pixel size. Thus, it is expected to have broad future application.

During photoinduction of charge carriers in the photosensitive detector when it is exposed to light, a bias (approximately −20-0 V) is applied to the substrate to bring the substrate into an equipotential state for each pixel, and it is necessary to arrange suitable isolation structures between adjacent pixels to prevent cross-talk between different pixels due to undesirable migration of photoinduced charge carriers. So far, there has been no photosensitive array proposed, which has a sufficiently small size (with a pixel region having a radial size that is, for example, less than 1 µm, which allows closer arrangement of pixels) while efficiently reducing cross-talk and allowing convenient creation of an equipotential environment for each pixel through applying a voltage to the substrate.

SUMMARY OF THE DISCLOSURE

The present invention provides a photosensitive array and an imaging apparatus having the same, which minimize inter-pixel cross-talk while allowing easy creation of an equipotential environment for each pixel by applying a voltage to the substrate, in contrast to conventional photosensitive arrays including the above-described one that is based on pixels each including a MOS capacitor and a readout transistor.

In one aspect of the present invention, there is provided a photosensitive array comprising a substrate and isolation structures formed in the substrate. The substrate defines a plurality of pixel regions arranged in rows and columns and one or more substrate tap region scattered among the pixel regions. Each pixel region comprises a photosensitive region for accommodating a MOS capacitor and a charge readout region for accommodating a readout transistor. Each pixel region corresponds one of the substrate tap regions, and the substrate of the pixel region continues with the substrate of the corresponding substrate tap region. The substrate tap region provides a voltage application location for the substrate of the corresponding pixel region. The columns include sets of two adjacent columns, in each of which sets the charge readout regions of each column directly face the charge readout regions of the other column while the photosensitive regions of each column are separated from the photosensitive regions of the other column by the charge readout regions, and each of which sets includes subsets of four pixel regions belonging to two adjacent ones of the rows and surrounding a corresponding one of the substrate tap regions. The isolation structures include through trench isolations extending through the substrate along a thickness direction thereof. The through trench isolations extend laterally within the substrate to isolate adjacent pixel regions, and the substrate of each pixel region continues with the substrate of the corresponding substrate tap regions.

Optionally, the isolation structures may include first and second isolations, which extend into the substrate from upper and lower surfaces thereof, respectively, terminate in the substrate, and extend laterally within the substrate, wherein at least some of the through trench isolations are each made of one of the first isolations and one of the second isolations that is vertically joined to the first isolation.

Optionally, the first isolations may isolate the photosensitive regions of the pixel regions from the charge readout regions thereof and isolate the pixel regions from the corresponding substrate tap regions.

Optionally, the second isolations may isolate adjacent pixel regions in such a manner that the substrate of the isolated pixel regions is discontinuous at the second isolations.

Optionally, the substrate tap regions may be arranged between the columns in each set of two adjacent columns of pixel regions, wherein each of the substrate tap regions corresponds to, and is surrounded by, four pixel regions belonging to two adjacent rows, or at least one of the substrate tap regions is each disposed between, and corresponds to, two pixel regions belonging to one row so as to provide a voltage application location for the substrate of the two pixel regions.

Optionally, in each set of two adjacent columns of pixel regions, the substrate tap regions may be arranged in line with the charge readout regions of the two columns along a column-wise direction of the pixel regions between the photosensitive regions of the two columns.

Optionally, the columns of pixel regions may include a plurality of subsets of pixel regions belonging to two adjacent columns, which are arranged side by side along a row-wise direction of the pixel regions, wherein the substrate tap regions scattered among the columns of pixel regions are arranged in rows and columns.

Optionally, the photosensitive array may further comprise a plurality of substrate leads on the substrate, each extending above a respective row of substrate tap regions and coming into electrical connection with the substrate via the row of substrate tap regions.

Optionally, some of the through trench isolations may form closed rings encircling the respective substrate tap regions and the corresponding pixel regions, with the other through trench isolations being arranged within the closed rings to isolate adjacent pixel regions, and the substrate of the pixel regions continues with the substrate of the corresponding substrate tap regions.

Optionally, each set of two adjacent columns may include a plurality of subsets of pixel regions belonging to two adjacent rows, in each of which subsets, the two pixel regions of each column correspond to two different ones of the substrate tap regions and share a common charge readout region, wherein some of the through trench isolations form open rings encircling the respective substrate tap regions and the corresponding pixel regions and being open at the common charge readout regions, the other through trench isolations are arranged within the open rings to isolate adjacent pixel regions, and the substrate of the pixel regions continues with the substrate of the corresponding substrate tap regions.

Optionally, the charge readout region of each pixel region may include a source accommodating region and a drain accommodating region, wherein the photosensitive array further comprises source and drain regions formed in the substrate in the respective source and drain accommodating regions.

Optionally, the source accommodating regions may be arranged into a plurality of rows, wherein the photosensitive array further comprises a plurality of source lines on the substrate, each extending over a respective row of source accommodating regions and coming into electrical connection with a respective row of source regions.

Optionally, the photosensitive array may further comprise a plurality of drain lines on the substrate, each extending over a respective column of pixel regions and coming into electrical connection with a respective column of drain regions.

Optionally, the photosensitive array may further comprise gate structures arranged on the substrate of the respective pixel regions, each gate structure spanning over the photosensitive and charge readout regions of a respective one of the pixel regions, each gate structure comprising, stacked sequentially from the bottom upward, a gate oxide layer, a floating gate, an inter-gate dielectric layer and a control gate, wherein the MOS capacitor comprising the gate structure and the substrate of the photosensitive region, and the readout transistor comprises the gate structure and the source and drain regions of the charge readout region.

Optionally, the photosensitive array may further comprise a plurality of control gate lines on the substrate, each crossing the photosensitive and charge readout regions of a respective row of pixel regions so as to serve as the control gates of the gate structures in the same row.

In another aspect of the present invention, there is provided an imaging apparatus including the photosensitive array as defined above.

In the photosensitive array of the present invention, the substrate of each substrate tap region continues with the substrate of the corresponding four pixel regions. Therefore, when a voltage is applied to the substrate of the substrate tap region, the voltage is also applied to the substrate of the corresponding pixel regions, creating an equipotential environment in the substrate for the four pixel regions surrounding the substrate tap region. In this way, during operation of the photosensitive array, it is made easier to keep the substrate of various pixels equipotential. Moreover, between the through trench isolations that extend laterally in the substrate so as to isolate adjacent pixel regions, gaps are left where the substrate of each pixel region continues with the substrate of the corresponding substrate tap region. As a result, a good isolation effect is achieved in the substrate of the pixel regions, and cross-talk between different pixels is mitigated.

The imaging apparatus of the present invention incorporates the above photosensitive array. As described above, the photosensitive array is associated with mitigated inter-pixel cross-talk and can create an equipotential environment in the substrate for various pixels therein by applying a voltage to the substrate of each pixel region during operation of the photosensitive array. The MOS capacitors and readout transistors in the photosensitive array are capable of light sensing, and pixels in the photosensitive array are allowed to have a reduced size. Therefore, the imaging apparatus can provide good photosensitive and imaging performance.

In these figures,

100 denotes a pixel region; 110, a photosensitive region; 120, a charge readout region; 200, a substrate tap region; 310, a through trench isolation; 320, a second isolation; and 410, a source region interconnect.

DETAILED DESCRIPTION

The photosensitive array and imaging apparatus provided in the present invention will be described in greater detail below by way of particular embodiments with reference to the accompanying drawings. Advantages and features of the present invention will become more apparent from the following description. Note that the figures are provided in a very simplified form not necessarily drawn to exact scale for the only purpose of helping to explain the embodiments disclosed herein in a more convenient and clearer way. Embodiments of the invention should not be construed as limited to the particular shapes of the regions illustrated in the figures. For the sake of clarity, throughout the figures that help illustrate the embodiments disclosed herein, like elements are in principle labeled with like reference numbers, and repeated descriptions thereof are omitted. As used herein, the terms "row" and "column" refer to two directions inclined with respect to each other at a certain angle. In some embodiments, the two terms may be used interchangeably. For example, the phrases "each two rows" and "adjacent rows" used in the following description may also be alternatively referred to as "each two columns" and "adjacent columns", respectively.

Figure 1:
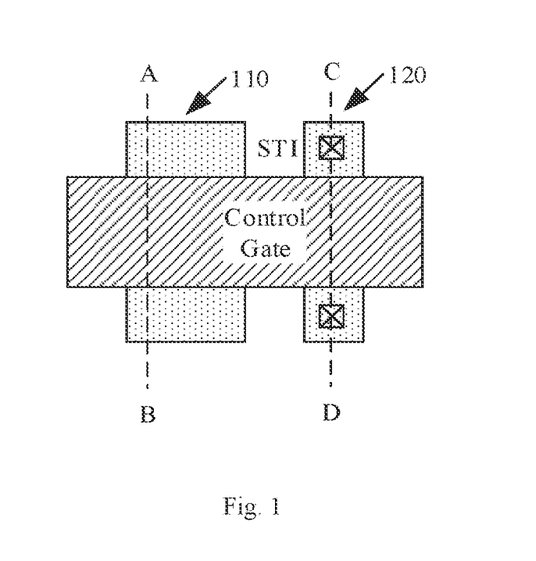
FIG. 1 is a schematic plan view of a vertical-charge-transfer pixel sensor (VPS) photosensitive element in a photosensitive array according to an embodiment of the present invention.
Figure 2:
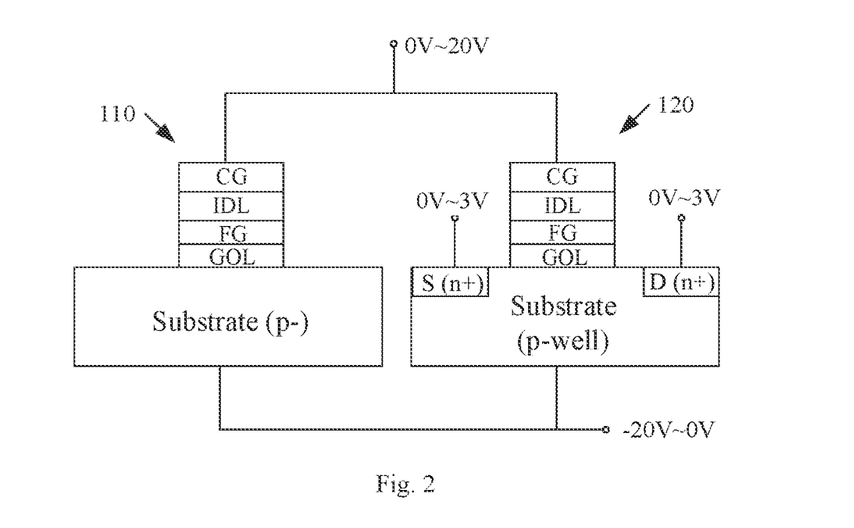
FIG. 2 shows a cross section and electrical wiring of the VPS in the photosensitive array according to an embodiment of the present invention.

Each pixel in a photosensitive array according to embodiments of the present invention employs the structure of the double-transistor photosensitive detector disclosed in Chinese Pat. Pub. No. CN102938409A, referred to hereinafter as the vertical-charge-transfer pixel sensor (VPS). FIG. 1 is a schematic plan view of the VPS in the photosensitive array, and FIG. 2 schematically illustrates a cross-sectional view and electrical wiring thereof. The left half of FIG. 2 may be seen as a cross-sectional view of the pixel of FIG. 1 taken along AB direction, while the right half may be taken as a cross-sectional view thereof along CD direction. How this pixel is structured and works to sense light will be described below with reference to FIGS. 1 and 2.

Referring to FIGS. 1 and 2, the pixel structure according to an embodiment of the present invention includes a gate structure disposed on a substrate, which laterally spans over a photosensitive region 110, a shallow trench isolation (STI) and a charge readout region 120 in the substrate. In addition, a source region (S) and a drain region (D) are formed on opposing sides of the gate structure in the substrate of the charge readout region 120. The gate structure includes, stacked over the substrate sequentially from the bottom upward, a gate oxide layer (GOL), a floating gate (FG), an inter-gate dielectric layer (IDL) and a control gate (CG). The substrate of the photosensitive region 110 (e.g., a lightly doped region with p-type ions, referred to hereinafter as the p-region) and the gate structure may form a MOS capacitor (corresponding to the left half of FIG. 2), and in the substrate of the charge readout region 120, for example, a p-type well (p-well) is formed, which is doped with p-type ions at a concentration that is, for example, higher than the p-type ions in the substrate of the photosensitive region. The source and drain regions formed on the top of the p-well and are, for example, heavily doped with n-type ions (n+). The gate structure and the source and drain regions in the underlying substrate of the charge readout region 120 form a readout transistor (corresponding to the right half of FIG. 2).

In order to enable the pixel to sense light, referring to FIG. 2, with it being exposed to light, a negative bias lower than 0V and higher than or equal to −20V (e.g., −3V) is applied to the substrate, and a positive bias higher than 0V and lower than or equal to 20V is coupled to the control gate, thus creating a continuous depletion region in the substrate. When photons of light incident on a lower surface (or backside) of the substrate reach the depletion region, they may excite charge carriers if the condition is proper, which are then driven by an electric field to migrate into the floating gate that is capable of charge storage. This phase takes place mainly in the photosensitive region of the MOS capacitor. In a subsequent charge readout phase, with both the source region and the substrate being grounded (0V) and with the drain region being coupled to a suitable positive bias (e.g., higher than 0V and lower than 3V), a voltage on the control gate is adjusted to cause the readout transistor to operate in a linear region. Since the photoelectron storage layer (i.e., the floating gate) is a continuous layer extending from the MOS capacitor to the readout transistor, the number of photoinduced charge carriers stored in the floating gate during the exposure phase can be determined from a measurement of a drain current drift. In a subsequent reset phase, the control gate is coupled to a negative bias and both the substrate and the source region of the readout transistor are coupled to the same positive bias (e.g., higher than 0V and lower than 3V) so that the photoinduced charge carriers in the floating gate move into the source region.

It is to be noted that the following description is set forth principally in the exemplary context of the readout transistor being implemented as an n-type transistor in which the source and drain regions are heavily doped n-type regions and the substrate is a lightly doped p-type substrate (e.g., doped with boron or boron difluoride), which make it easier to create the electric field in the depletion region during exposure. It would be appreciated that the readout transistor may be alternatively implemented as a p-type transistor in which the source and drain regions are heavily doped p-type regions and the substrate is a lightly doped n-type substrate (e.g., doped with phosphorus or arsenic).

When designing a photosensitive array with a plurality of the above pixels, in order for the advantages of such pixels to fully play their role in maximizing the array's photosensitive performance, i.e., a simple structure and a relatively small pixel size (typically, each pixel occupies a substrate region with a radial size that is at most 1 µm or even 0.5 µm), it is important to minimize cross-talk between adjacent pixels and to apply an equal voltage to each pixel so as to create an equipotential environment for the pixels throughout the light sensing process (e.g., so that the depletion region in the substrate of each pixel creates an electric field having a substantially same strength during the exposure phase). All of these can be achieved by the photosensitive array according to embodiments of the present invention, as detailed below.

Embodiments of the present invention relate to a photosensitive array comprising a substrate and isolation structures formed in the substrate. The substrate may be any of various suitable substrates known in the art, such as a silicon substrate doped with p-type ions at a low concentration (p−), such as boron ions at a density of $1 \times 10^{12}/cm^2$ to $2 \times 10^{12}/cm^2$.

This allows the creation of a relatively wide depletion region in the substrate during the exposure phase, which is helpful in improving photoconversion quantum efficiency. A distribution of the various regions in the substrate and the isolation structures will be described below.

Figure 3A:
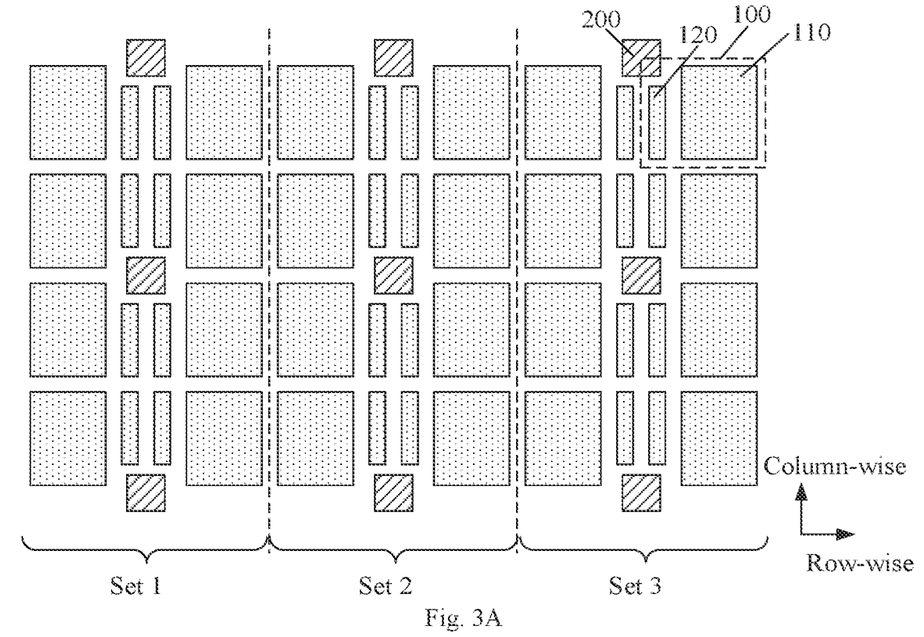
FIGS. 3A and 3B are schematic plan views showing how pixel regions are distributed in the photosensitive array according to an embodiment of the present invention.
Figure 3B:
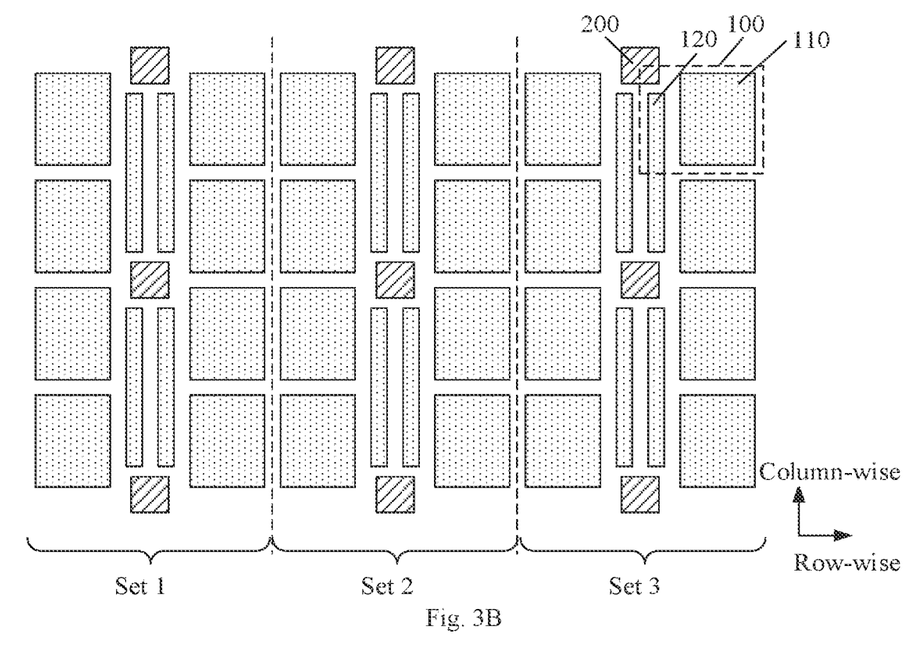

FIGS. 3A and 3B are both schematic plan views showing how pixel regions are distributed in the photosensitive array according to an embodiment of the present invention. Referring to FIGS. 3A and 3B, the substrate has a plurality of pixel regions 100 arranged in rows and columns (here, the phrase "arranged in rows and columns" means that the pixel regions 100 are arranged in a plane perpendicular to the thickness direction of the substrate and can be projected to the upper or lower surface of the substrate or a plane therein; this also applies to the following embodiments) and substrate tap regions 200 between the pixel regions 100. Each pixel region 100 includes a photosensitive region 110 where the MOS capacitor of the above-described VPS is formed and a charge readout region 120 where the readout transistor of the VPS is formed. Each pixel region 100 corresponds to one of the substrate tap regions 200, and the substrate of each pixel region 100 continues with the substrate of the respective corresponding substrate tap region 200. Each substrate tap region 200 provides a voltage application location for the substrate of the respective corresponding pixel region 100.

Additionally, in the pixel regions 100 arranged in multiple columns, those in at least two adjacent columns are so arranged that the charge readout regions 120 of each column directly face the charge readout regions 120 of the other column while the photosensitive regions 110 of each column are separated from the photosensitive regions of the other column by the charge readout regions 120. In other words, the pixel regions 100 in the two adjacent columns are arranged in such a manner that, in the pixel regions 100 of each column, the photosensitive regions 110 are arranged into a column, and the charge readout regions 120 are also arranged into a column. Moreover, the two columns of charge readout regions 120 directly face each other, and the two columns of photosensitive regions 110 are separated from each other by the charge readout regions 120. Further, in these two adjacent columns of pixel regions 100, the two charge readout regions 120 of the same row directly face each other, and the two photosensitive regions 110 of the same row are separated from each other by the charge readout regions 120. In some embodiments, the pixel regions 100 may form two or more such sets of adjacent columns, e.g., Set 1, Set 2 and Set 3, as shown in FIGS. 3A and 3B, which are arranged side by side along the row-wise direction of the pixel regions 100. Moreover, in each of the sets, the charge readout regions 120 of each column directly face the charge readout regions 120 of the other column while the photosensitive regions 110 of each column are separated from the photosensitive regions of the other column by the charge readout regions 120.

The pixel regions, the photosensitive and charge readout regions therein and the substrate tap regions may be delimited by isolation structures (e.g., shallow trench isolations (STIs)) formed in the substrate. In order to minimize crosstalk between adjacent pixel regions, in embodiments of the present invention, some of the regions may be isolated using through trench isolations extending the substrate from its lower surface to upper surface, as described in greater detail below.

In embodiments of the present invention, each set of two adjacent columns of pixel regions in which the charge readout regions 120 of each column directly face the charge readout regions 120 of the other column while the photosensitive regions 110 of each column are separated from the photosensitive regions of the other column by the charge readout regions 120 includes subsets each containing four pixel regions 100 belonging to two adjacent rows and surrounding a single corresponding substrate tap region 200. The substrate of the substrate tap region 200 continues with, and thus provides a voltage application location for, the substrate of the four surrounding pixel regions 100. In other words, when a voltage is applied to the substrate of the substrate tap region 200, the substrate of the four surrounding pixel regions 100 that correspond to the substrate tap region 200 is applied with the same voltage (thus making the pixel regions 100 equipotential).

The substrate tap region 200 is located, for example, at or near a geometric center of the corresponding four pixel regions 100. The substrate of the substrate tap region 200 may be electrically connected to a contact plug disposed in the substrate, which may be brought into contact with a substrate lead fabricated of, for example, a metallic material and separately arranged in the substrate. In this way, the pixel regions can be made equipotential by applying a voltage to the substrate via the substrate lead. In order to facilitate the application of the voltage to the substrate, ions may be implanted into the substrate of the substrate tap region 200 to increase the conductivity of the substrate surface of the substrate tap region 200. For example, a top portion of the substrate of the substrate tap region 200 may be heavily doped with a p-type dopant (p+). In addition, source and drain regions, which are, for example, heavily doped with n-type ions (n+) may be formed in the substrate of each charge readout region 120 as part of the readout transistor.

In one embodiment, a plurality of substrate tap regions 200 are arranged between the two adjacent columns of each of the aforementioned sets which are arranged side by side along the row-wise direction and in which the charge readout regions 120 of each column directly face the charge readout regions 120 of the other column while the photosensitive regions 110 of each column are separated from the photosensitive regions of the other column by the charge readout regions 120. Referring to FIG. 3A, the substrate tap regions 200 between the two adjacent columns of pixel regions 100 are arranged side by side along the column-wise direction of the pixel regions 100, for example. Each set of two adjacent columns of pixel regions 100 includes subsets each containing four pixel regions 100, which belong to two rows adjacent to each other in the column-wise direction and surround a corresponding single one of the substrate tap regions 200. The substrate tap region 200 provides a voltage application location for the substrate of the four surrounding pixel regions 100. In each of the sets of two adjacent columns of pixel regions 100, the substrate tap regions 200 arranged side by side along the column-wise direction of the pixel regions 100 may be particularly scattered among, and aligned with, the charge readout regions 120 that separate the two columns of photosensitive regions 110 from each other. In other words, the substrate tap regions 200 and the pairs of directly facing charge readout regions 120 form a single column. In this embodiment, in each set of two adjacent columns of pixel regions 100, the charge readout regions 120 of the two pixel regions 100 in each row directly face each other, and the substrate tap regions 200 and the pairs of directly facing charge readout regions 120 form a single column. Since the VPS performs light sensing mainly in the photosensitive regions, the substrate tap regions 200 column-wise scattered among and aligned with the charge readout regions 120 result in area savings for the photosensitive regions 110, helping to ensure good photoelectric conversion efficiency.

In this embodiment, in each subset in each of the aforementioned sets, the four pixel regions 100 belonging to two rows adjacent to each other along the column-wise direction surround and share a single corresponding substrate tap region 200 (and do not correspond to any other pixel region). Each of the four pixel regions 100 corresponds to only one substrate tap region 200 so that a voltage can be applied to the substrate of the corresponding pixel regions 100 via the substrate tap region 200. This arrangement allows easy fabrication of the pixels with a reduced size.

The embodiment shown in FIG. 3B differs from that of FIG. 3A in that in each column of pixel regions 100, each two adjacent pixel regions 100 not sharing a common substrate tap region 200 (i.e., corresponding to different substrate tap regions 200) share a common charge readout region 120. This arrangement at least dispenses with the need to arrange an isolation structure on the top of the substrate of the charge readout region 120. This allows the readout transistors of the two pixel regions sharing the charge readout region 120 to share a source or drain region, thus simplifying the fabrication process.

It would be appreciated that the number and shape of the pixel regions shown in FIGS. 3A and 3B are merely exemplary. In other embodiments of the present invention, the various regions in the photosensitive array may have other shapes as shown. For example, in some embodiments, the pixel regions 100, the photosensitive regions 110, the charge readout regions 120 and the substrate tap regions 200 may be individually shaped otherwise. For example, other than rectangular, they may also be circular, rhombic, triangular, pentagonal, hexagonal, elliptical, irregularly or otherwise shaped. Additionally, the pixel regions 100 in each row or column may not be arranged in a straight line. For example, in one embodiment, the charge readout regions 120 of the pixel regions 100 in each column may be arranged along the column-wise direction in a wavy pattern. Further, in some embodiments, the photosensitive array may combine the arrangement of pixel regions shown in FIG. 3A with that shown in FIG. 3B. Furthermore, depending on the arrangement of the pixel regions in the rows and columns of the photosensitive array, some of the substrate tap regions 200 may also each provide a voltage application location for the substrate of two pixel regions, as detailed below.

As an example, although each set of two adjacent columns of pixel regions 100 in the photosensitive array in which the charge readout regions 120 of each column directly face the charge readout regions 120 of the other column while the photosensitive regions 110 of each column are separated from the photosensitive regions of the other column by the charge readout regions 120 has been described above as including a plurality of subsets each containing four pixel regions 100 belonging to two rows adjacent to each other along the column-wise direction and one of the above substrate tap regions 200, which is surrounded by the four pixel regions 100, the present invention is not so limited because in one embodiment, in each set of two adjacent columns of pixel regions 100, some subsets may each include only two pixel regions 100 that share a common substrate tap region 200 (e.g., those in the top and bottom rows as shown in FIGS. 3A and 3B). In other words, at least one of the substrate tap region 200 may be disposed between and correspond to two pixel regions 100 of the same row so as to provide a voltage application location for the substrate of the two pixel regions 100. In addition, the pixel regions 100 of adjacent columns in the photosensitive array may be grouped along the row-wise direction into subsets each containing two pixel regions 100 of respective two adjacent columns, in which the charge readout region of each pixel region directly faces the charge readout region of the other pixel region while the photosensitive region of each pixel region is separated from the photosensitive region of the other pixel region by the charge readout regions. However, in some embodiments, there may be one column that is not grouped with any adjacent column. In this case, the pixel regions 100 in the column may be column-wise grouped into subsets each containing two adjacent pixel regions with a corresponding one of the substrate tap regions 200 being disposed therebetween to serve as a voltage application location for the substrate of them.

In embodiments of the present invention, the pixel regions and substrate tap regions are arranged in the photosensitive array in the manner as described above. The pixel regions 100 may be also be grouped along the row-wise direction into subsets each containing two pixel regions 100 of respective two adjacent columns, in which the charge readout region 120 of each pixel region directly faces the charge readout region 120 of the other pixel region while the photosensitive region 110 of each pixel region is separated from the photosensitive region 110 of the other pixel region by the charge readout regions 120. In addition, the substrate tap regions 200 are arranged along the column-wise direction in the sets between the paired adjacent columns of pixel regions 100 therein. The substrate tap regions 200 scattered among the columns pixel regions 100 may be, for example, arranged in rows and columns.

In embodiments of the present invention, the photosensitive array also includes isolation structures disposed in the substrate where the pixel regions 100 and the substrate tap regions 200 are formed. Moreover, the isolation structures include through trench isolations extending through the substrate in the thickness direction thereof, as detailed below.

Figure 4A:
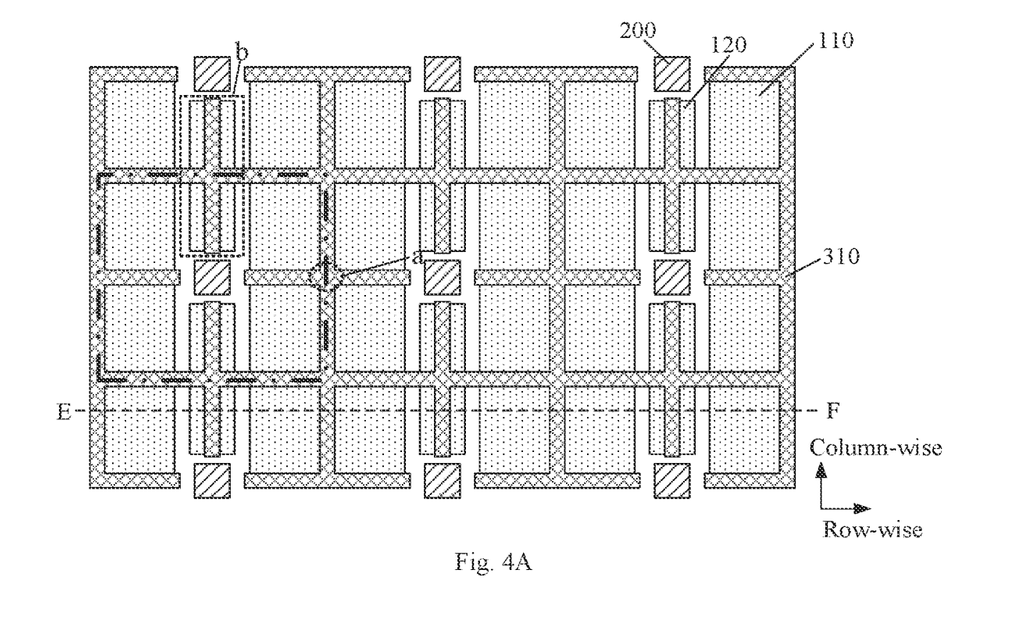
FIGS. 4A and 4B are schematic plan views showing how through trench isolations are distributed in the photosensitive array according to an embodiment of the present invention.
Figure 4B:
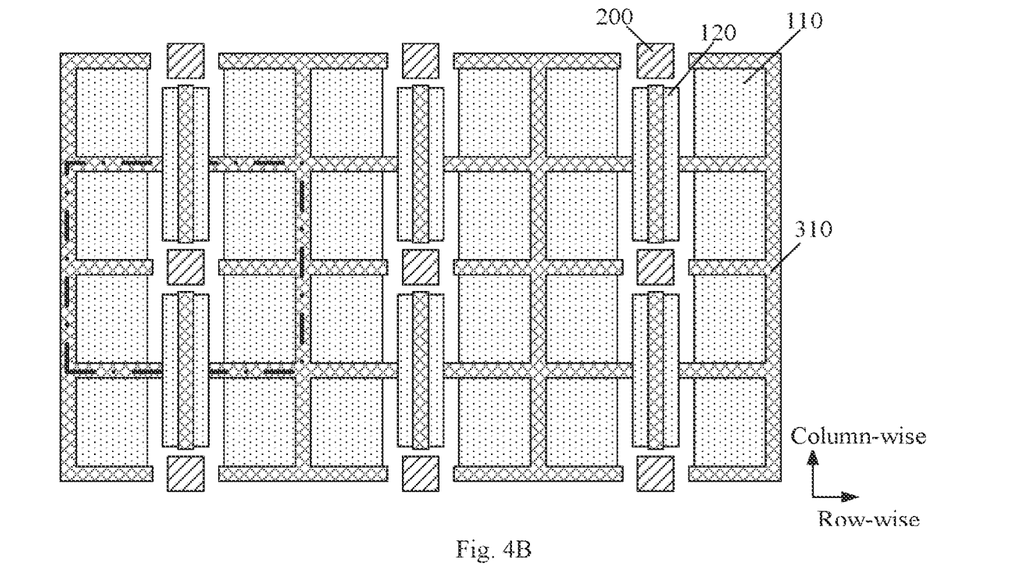

FIGS. 4A and 4B are both schematic plan views showing through trench isolations in the photosensitive array according to embodiments of the present invention. In these embodiments, the pixel regions are arranged, for example, as shown in FIGS. 3A and 3B. FIG. 4A shows the arrangement of the through trench isolations across the substrate surface of FIG. 3A, and FIG. 4B shows the arrangement of the through trench isolations across the substrate surface of FIG. 3B. As shown in FIGS. 4A and 4B, the isolation structures formed in the substrate include through trench isolations 310 extending through the substrate along the thickness direction thereof (i.e., terminating at both its upper and lower surfaces). Each of the through trench isolations 310 extends laterally in the substrate (i.e., in a plane perpendicular to the thickness direction of the substrate) to provide physical isolation between adjacent pixel regions 100. In addition, there are gaps between the through trench isolations 310, where the substrate of each pixel region 100 continues with the substrate of the corresponding substrate tap region 200.

The through trench isolations 310 may be arranged as practically required. As shown in FIG. 4A, in one embodiment, in a given portion of the substrate where pixel regions and a corresponding substrate tap region are formed (the area of the portion is smaller or equal to the total area of the pixel regions and substrate tap region), the charge readout regions 120 of the pixel regions 100 are independently arranged so that through trench isolations 310 are arranged between adjacent charge readout regions 120. In addition, some of the through trench isolations 310 form a closed ring surrounding the substrate tap region 200 and the corresponding pixel regions 100 (as indicated by the dot-dash box in FIG. 4A, as an example), and the other through trench isolations 310 are arranged within the closed ring to isolate adjacent pixel regions 100, with gaps being left where the substrate of the pixel regions 100 continues with the substrate of the corresponding substrate tap region 200. However, the present invention is not so limited, because the through trench isolations may alternatively surround the substrate tap region 200 and the corresponding pixel regions 100 not in the form of a close ring but in the form of an open ring or multiple segments. For example, in one embodiment, considering the fact that photoinduced electrons are produced mainly in the substrate of the photosensitive regions during the exposure phase and then vertically move toward the gate oxide layers, through trench isolations may be arranged only between adjacent photosensitive regions but not between non-adjacent photosensitive regions (as with the case of region a in FIG. 4A) and/or not between charge readout regions (as with the case of region b in FIG. 4A).

As shown in FIG. 4B, in one embodiment, in a given portion of the substrate where two adjacent pixel regions 100 in the same column correspond to different substrate tap regions 200 and share a common charge readout region 120 (the area of the portion is smaller or equal to the total area of the pixel regions and substrate tap regions), it is not necessary to arrange a through trench isolation 310 for the charge readout region 120 of the two pixel regions 100. In this embodiment, some of the through trench isolations 310 form an open ring with a gap at the common charge readout region 120, which surround the substrate tap regions 200 and the corresponding pixel regions 100 (as indicated by the dot-dash box in FIG. 4B, as an example), and the other through trench isolations 310 are arranged within the closed ring to isolate the adjacent pixel regions 100, with gaps being left where the substrate of the pixel regions 100 continues with the substrate of the corresponding substrate tap regions 200. In other embodiments, the through trench isolations may form another non-closed shape that surrounds the substrate tap regions 200 and the corresponding pixel regions 100. For example, in one embodiment, considering the fact that photoinduced electrons are produced mainly in the substrate of the photosensitive regions during the exposure phase and then vertically move toward the gate oxide layers, through trench isolations may be arranged only between adjacent photosensitive regions but not between non-adjacent photosensitive regions and/or not between charge readout regions (as with the case of region b in FIG. 4A).

Specifically, as there are gaps left between the through trench isolations 310 arranged in the closed or open ring, where the substrate of each pixel region 100 continues with the substrate of the corresponding substrate tap region 200, in each subset of pixel regions 100 in which the pixel regions 100 are of two adjacent columns, with the charge readout regions 120 of each column directly facing the charge readout regions 120 of the other column and with the photosensitive regions 110 of each column being separated from the photosensitive regions of the other column by the charge readout regions 120, all the pixel regions 100 are isolated by the through trench isolations 310. Moreover, in each such subset of pixel regions 100, some of the through trench isolations 310 may extend between the mutually separated photosensitive regions 110 and between the mutually facing charge readout regions 120 so as to provide a maximized physical isolation effect. As shown in FIGS. 4A and 4B, there are some through trench isolations 310 extending in the column-wise direction to separate adjacent sets of pixel regions 100, some through trench isolations 310 extending between, with substrate tap regions 200 being scattered among them, the two columns in each set of pixel regions 100 (more exactly, between the mutually facing charge readout regions 120 of them), and some through trench isolations 310 extending in the row-wise direction between the photosensitive regions 110 of column-wise adjacent pixel regions 100.

Figure 5:
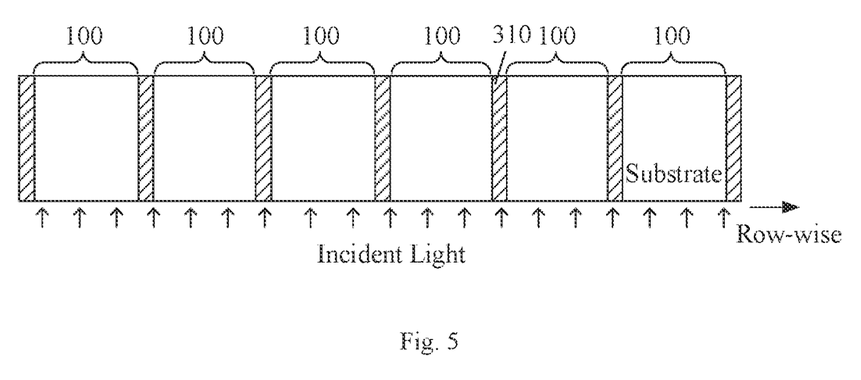
FIG. 5 is a schematic cross-sectional view of some of the through trench isolations in the photosensitive array according to an embodiment of the present invention.

FIG. 5 is a schematic cross-sectional view of some through trench isolations in the photosensitive array according to an embodiment of the present invention. The schematic cross-sectional view of FIG. 5 is taken along line EF in FIG. 4A. Pixel components disposed above the substrate are omitted from FIG. 5. As shown in FIG. 5, the through trench isolations 310 extend through the substrate in the thickness direction thereof, thereby partitioning the substrate of the pixel regions 100. However, the substrate is continues in thickness between the photosensitive region 110 and the charge readout region 120 in each pixel region 100 and between each substrate tap region 200 and the corresponding pixel regions 100 so as to be able to be maintained equipotential when a voltage is applied thereto, as desired by the operation of the imaging array. When light is incident on the lower surface of the substrate, photoinduced charge carriers produced in the substrate of the affected pixel regions 100 move toward the upper surface of the substrate under the action of a depleting electric field. At the same time, blocked by the through trench isolations 310, photoinduced charge carriers substantially move only in the substrate portions of the individual pixel regions 100. This can mitigate cross-talk between different pixel regions 100, resulting in increased charge readout accuracy and improved light sensing and imaging performance. Although the through trench isolations 310 do not physically isolate the pixel regions 100 of the two columns in each column-wise set or pixel regions 100 of different rows in a complete manner, since the migration of photoinduced charge carriers from the substrate to the floating gates occurs mainly in the photosensitive regions, the through trench isolations 310 can still provide good isolation of the photoinduced charge carriers in the individual pixel regions.

The through trench isolations may be formed of a material (i.e., isolating dielectric) including at least one of silicon dioxide, silicon nitride and silicon oxynitride in the substrate by any suitable process known in the art. For example, the formation of the through trench isolations may involve forming through trenches in the substrate using an etching process and filling the through trenches with the dielectric. In case of the substrate to be later thinned from the backside (i.e., the lower surface side), deep trenches may be formed in the substrate from the upper surface side and then filled with the isolating dielectric. After the completion of the pixel structures on the upper surface side of the substrate, a backside thinning process may be performed to remove the substrate portion not penetrated by the trenches, resulting in the formation of the through trench isolations extending from the upper to lower surface of the substrate. However, the present invention is not so limited. In one embodiment, at least some of the through trench isolations 310 may be fabricated by forming trenches from both the upper and lower surface sides of the substrate and filling the trenches with the isolating dielectric.

Specifically, the isolation structures may include first and second isolations, which extend in the substrate from the upper and lower surfaces of thereof, respectively, and terminate within the substrate. In addition, they both extend laterally in the substrate. In addition, at least some of the through trench isolations 310 are each made up one of the second isolations and one of the first isolations that is vertically joined to the second isolation. In one embodiment, the first and second isolations may be formed separately, and the through trench isolations 310 may be formed once the formation of the first and second isolations is completed. This can simplify the fabrication process, when compared to designing a separate process for forming the through trench isolations that extend through the substrate in the thickness direction thereof.

The first isolations may be, for example, shallow trench isolations (STIs). Some of the first isolations are used as part of the through trench isolations 310, and the others serve to isolate the pixel regions 100 from the corresponding substrate tap regions 200 and isolate the photosensitive regions 110 from the charge readout regions 120 in the pixel regions 100. The first isolations may have a depth depending on the substrate's thickness and a degree of isolation desired by the photosensitive array. At any portion of the substrate accommodating a first isolation, the substrate continues with, and is not isolated from, the surrounding substrate at the lower non-penetrated thickness. Thus, the operation of the MOS capacitors and the readout transistors is not affected, and the function of the substrate tap regions 200 is still allowed.

The second isolations may be, for example, deep trench isolations (DTIs), which extend into the substrate from the backside thereof but not through the substrate. Therefore, at any portion of the substrate accommodating a second isolation, the substrate still continues with, and is not isolated from, the surrounding substrate at the upper non-penetrated thickness. Thus, the function of the substrate tap regions 200 is not affected. In order to provide a better isolation effect between adjacent pixel regions, in one embodiment, in addition to those used as part of the through trench isolations 310, some of the second isolations may serve to isolate different pixel regions 100 in such a manner that the substrate of the isolated pixel regions 100 does not continue (i.e., is physically partitioned) at the second isolations. This can better avoid photoinduced charge carriers produced in the isolated pixel regions during the exposure phase from diffusing into adjacent pixel regions and thus further mitigate cross-talk therebetween.

Figure 6A:
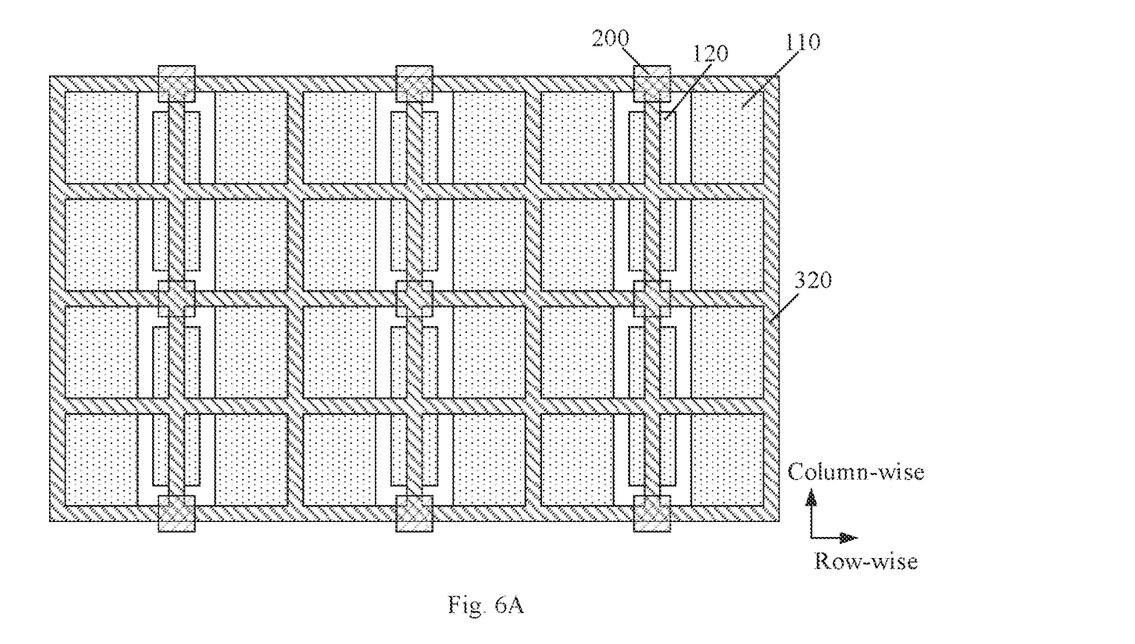
FIGS. 6A and 6B are schematic plan views of second isolations in the substrate of the photosensitive array according to an embodiment of the present invention.
Figure 6B:
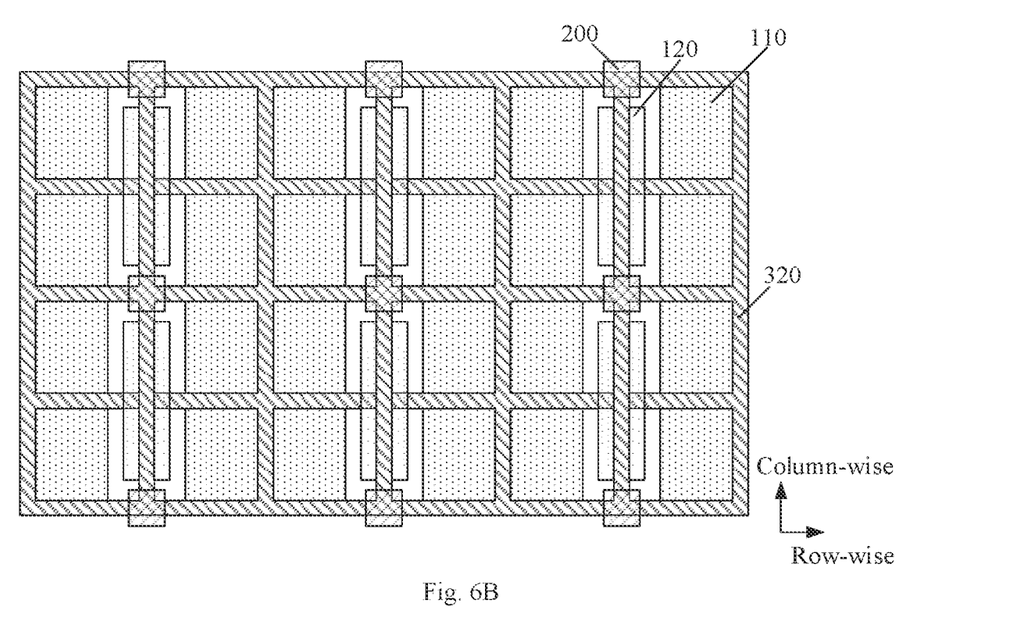

FIGS. 6A and 6B are schematic plan views of second isolations in the substrate of the photosensitive array according to an embodiment of the present invention. In this embodiment, the pixel regions are arranged, for example, also as shown in FIGS. 3A and 3B. FIGS. 6A and 6B correspond to the arrangements of FIGS. 3A and 3B, respectively. Referring to FIGS. 6A and 6B, the second isolations 320 may be arranged into a mesh, as seen from the plan views, with each pixel regions being delimited within a cell of the mesh. On the upper surface side of the substrate, in addition to the substrate tap regions 200, first isolations may be arranged in alignment with some of the second isolations. Each such pair of first and second isolations may have a total depth greater than or equal to the thickness of the substrate. This can result in not only an improved isolation effect but also the formation of through trench isolations 310 by the pairs of aligned first and second isolations.

The first and second isolations may be made separately on the upper and lower surface sides of the substrate, respectively, by forming trenches into a predetermined pattern using an etching process and then filling them with an isolating dielectric including at least one of silicon dioxide, silicon nitride and silicon oxynitride. Depths of the first and second isolations may be determined according to the thickness of the substrate and a degree of isolation desired by the photosensitive array.

According to an embodiment of the present invention, the readout transistors in the charge readout regions 120 may be interconnected like a NOR architecture used in flash memory device. In a particular example, the control gates of the readout transistors in each row of pixel regions 100 are all connected to a single control gate line (CG line), and the drain regions of the readout transistors in each column of pixel regions 100 are all connected to a single drain line (bit line). Additionally, the source regions of the readout transistors in each column of pixel regions 100 are all connected to a single source line. The photosensitive array may include, arranged in, on or above the substrate, a plurality of gate structures, a plurality of control gate lines, a plurality of drain lines, a plurality of source lines and a plurality of substrate leads connecting the substrate tap regions, which are configured to control pixels in the photosensitive array to perform the above-described light sensing process, as detailed below.

Referring to FIGS. 1 and 2, according to embodiments of the present invention, the photosensitive array may include gate structures each arranged on the substrate in a respective corresponding one of the pixel regions 100. The gate structure may laterally span over the photosensitive region 110 and the charge readout region 120 of the pixel region 100 and may include, stacked on the upper surface of the substrate sequentially from the bottom upward, a gate oxide layer, a floating gate, an inter-gate dielectric layer and a control gate. The gate structure may further include a spacer covering side walls of the gate oxide layer, the floating gate, the inter-gate dielectric layer and the control gate. In addition, in the photosensitive array, each pixel region 100 may include a source accommodating region and a drain accommodating region, which are both situated within the charge readout region 120 of the pixel region. The photosensitive array may further include source (S) and drain (D) regions formed in the substrate in the respective source and drain accommodating regions. The source and drain regions may be formed on the top of the substrate in the charge readout regions 120 by ion implantation, following the formation of the gate structures on the substrate. With this done, vertical-charge-transfer pixel sensors (VPS) corresponding to the respective pixel regions, i.e., pixels of the photosensitive array, are formed. In the photosensitive array, each pixel corresponding to a corresponding one of the pixel regions 100 has the above-described VPS structure, in which a portion of the gate structure in the photosensitive region 110 constitutes a MOS capacitor of the VPS together with the substrate in the same region, and the rest of the gate structure in the charge readout region 120 and the source and drain regions constitutes a readout transistor of the VPS. The control gates of pixel regions in the same row may be connected together.

Figure 7:
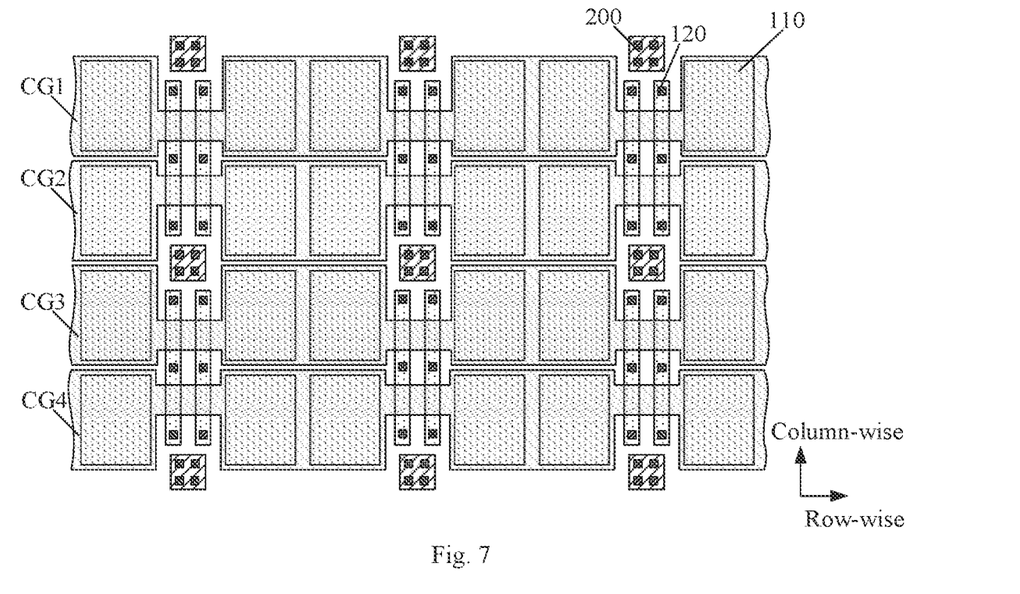
FIG. 7 is a diagram schematically illustrating source accommodating regions, drain accommodating regions and control gate lines in the photosensitive array according to an embodiment of the present invention.

FIG. 7 is a diagram schematically illustrating the source accommodating regions, the drain accommodating regions and the control gate lines in the photosensitive array according to an embodiment of the present invention. Referring to FIG. 7, the photosensitive array includes a plurality of control gate lines on the substrate (e.g., CG1, CG2, CG3 and CG4, as shown in FIG. 7 as an example) each extending in the row-wise direction across the photosensitive regions 110 and the charge readout regions 120 of pixel regions 100 in a corresponding row and serving as control gates of the gate structures in the same row.

In an embodiment of the present invention, in each row-wise subset of pixel regions 100 in the photosensitive array, the charge readout regions 120 of the two pixel regions 100 in the same row may be arranged side by side along the row-wise direction and isolated from each other by one of the above-discussed through trench isolations 310. In addition, the source and drain accommodating regions of each charge readout region 120 may be located on opposing sides of the gate structure portion therein. Accordingly, the source and drain regions of each readout transistor may be formed in the substrate in the source and drain accommodating regions, respectively. The source and drain regions may be electrically connected to contact plugs. The source and drain regions may be of the same doping type that is opposite to a doping type of the substrate tap region 200. For example, the source and drain regions may be n+ doped, while the substrate tap region 200 may be p+ doped. Contact plugs may be formed in a dielectric layer deposited on the substrate and brought into connection with the source regions, the drain regions and the substrate tap regions 200 (as indicated by the crossed boxes in FIG. 7) so as to enable their external electrical connection.

Referring to FIG. 7, in one embodiment, in case of the column-wise subsets each containing two pairs of column-wise adjacent pixel regions 100 corresponding to different substrate tap regions and sharing common charge readout regions 120, some of the above-discussed second isolations (DTIs) may be arranged on the lower surface side of the substrate in the common charge readout regions 120 to isolate the adjacent pixel regions 100, with the substrate being still continuous at the upper non-penetrated thickness portion. In addition, each pair of pixel regions 100 sharing a common charge readout region 120 may also share a common source accommodating region but have individual drain accommodating regions arranged on opposing sides of the common source accommodating region. This can additionally simplify circuit design and reduce fabrication complexity.

Figure 8:
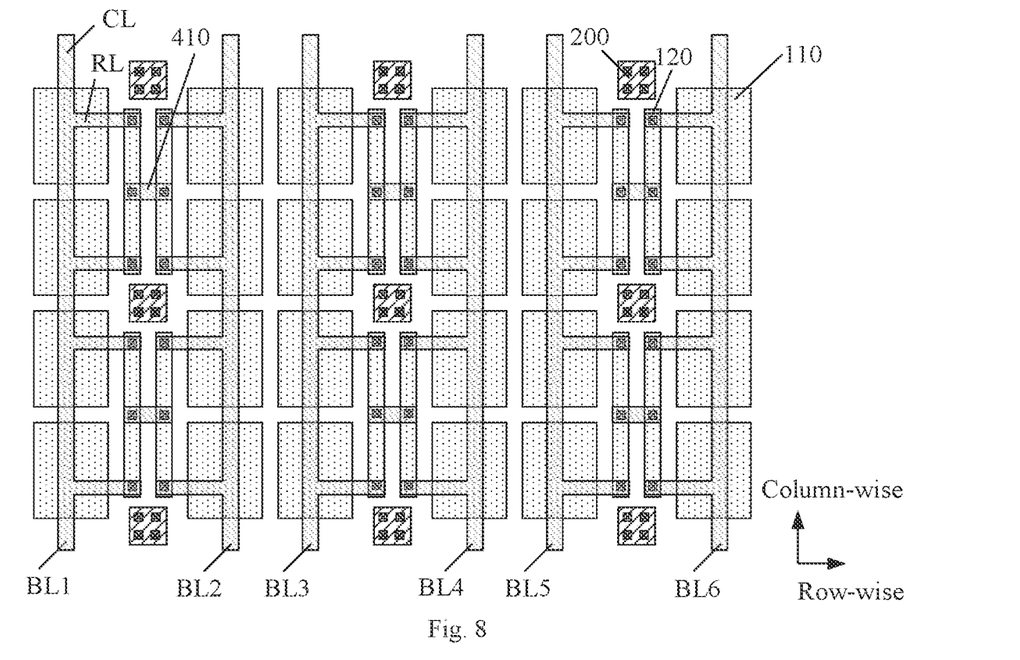
FIG. 8 is a schematic illustration of drain lines in the photosensitive array according to an embodiment of the present invention.

FIG. 8 is a schematic illustration of drain lines in the photosensitive array according to an embodiment of the present invention. Referring to FIG. 8, the photosensitive array may further include a plurality of drain lines on the substrate (e.g., BL1, BL2, BL3, BL4, BL5 and BL6, as shown in FIG. 8 as an example) each extending along the column-wise direction above a corresponding column of pixel regions 100 and coming into electrical connection with the drain regions of the same column (more exactly, it is electrically with the drain regions in the substrate by means of the drain accommodating regions of the underlying pixel regions 100). As shown in FIG. 8, in order to route away from where the source regions are externally connected, each drain line may include a column-wise section (CL) extending in the column-wise direction and a plurality of row-wise sections (RL), each perpendicularly joined to the column-wise section and connecting a respective drain region to the column-wise section and thus to the drain line. The drain lines may be electrically conductive leads isolated by an insulating material (referred to as the first insulating material layer) from the substrate. In the first insulating material layer, there may also be arranged contact plugs connecting the drain lines to the drain regions.

Further, a plurality of source region interconnects 410 may be formed of a conductive material in the same layer as the drain lines that is isolated by the first insulating material layer from the substrate. Each source region interconnect 410 may be arranged above two common source accommodating regions, which are of the same row and oppose each other, and electrically coupled to the underlying source regions corresponding to the source accommodating regions by contact plugs disposed in the first insulating material layer. Thus, with each source region interconnect 410 connecting two common source regions in one row, through connecting these source region interconnects 410 of the same row, control of the common source regions of the same row is enabled. The common source regions based on the common charge readout regions 120 may be, for example, arranged into multiple rows, and accordingly, the corresponding source region interconnects 410 may also be arranged into multiple rows. However, the present invention is not so limited. In an alternative embodiment, adjacent pixel regions 100 may not share common charge readout regions 120, and the source accommodating regions arranged in the charge readout regions 120 may thus be not shared ones. In this case, each source region interconnect 410 may be arranged in a substrate tap region 200 above the source accommodating regions of two pixel regions 100 of one row that both correspond to and commonly share the substrate tap region 200 so as to connect the source regions corresponding to the two source accommodating regions to each other. Source region interconnects 410 for each row of pixel regions 100 may be, for example, arranged along the row-wise direction.

Figure 9:
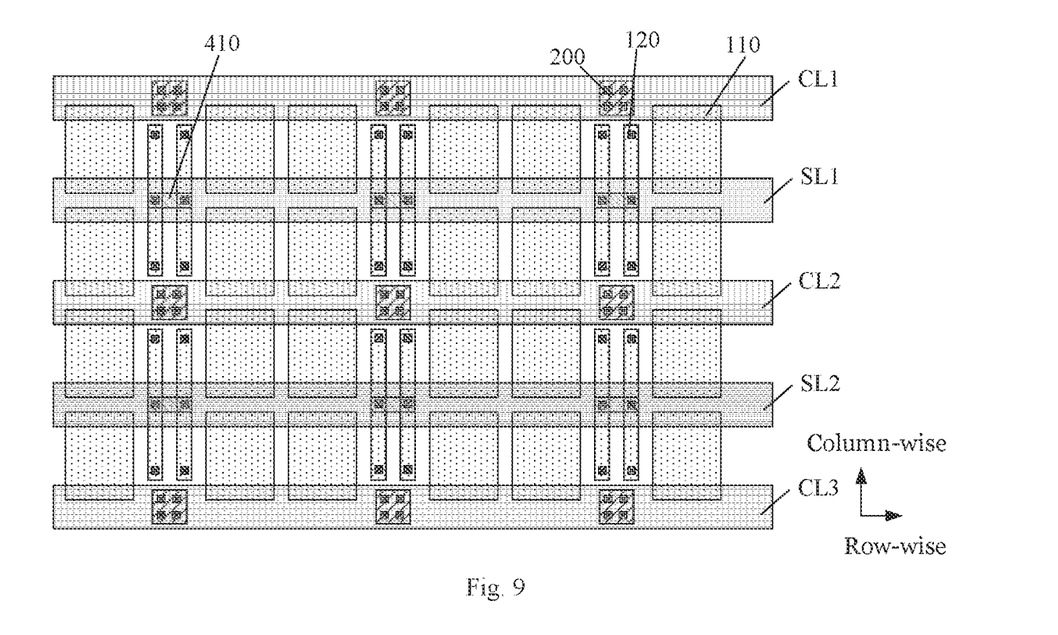
FIG. 9 is a schematic illustration of source lines and substrate leads in the photosensitive array according to an embodiment of the present invention.

FIG. 9 is a schematic illustration of source lines and substrate leads in the photosensitive array according to an embodiment of the present invention. Referring to FIG. 9, in one embodiment, the above-described source accommodating regions are, for example, arranged along the row-wise direction into multiple rows. Moreover, the photosensitive array includes a plurality of source lines on the substrate (e.g., SL1 and SL2, as shown in FIG. 9 as an example), each extending along the row-wise direction over a row of source accommodating regions and coming into electrical connection with a respective row of source regions (more exactly, it is electrically connected to the source regions in the substrate by means of the source accommodating regions). Referring to FIGS. 8 and 9, in one embodiment, each source line may be arranged above a respective row of source region interconnects 410 and may be implemented as an electrically conductive lead isolated from the source region interconnects 410 by an intervening insulating material (referred to as the second insulating material layer). In the second insulating material layer, there may also be arranged contact plugs connecting the source lines to the source region interconnects 410. In this way, each source line is brought into electrical connection with an underlying row of source region interconnects 410, and since each source region interconnects 410 in this row is electrically connected to source regions in the substrate, all the source regions of the same row are connected together by the source line. Thus, control of the source regions is enabled.

Referring to FIG. 9, in an embodiment of the present invention, in addition to multiple rows of substrate tap regions 200 arranged on the substrate as detailed above, the photosensitive array may further include a plurality of substrate leads (e.g., CL1, CL2 and CL3, as shown in FIG. 9 as an example) also arranged on the substrate, each extending in the row-wise direction over a respective row of substrate tap regions 200 and coming into electrical connection with the substrate via the row of substrate tap regions 200. A voltage may be applied to the substrate of the pixel regions 100 via the substrate leads so as to make the substrate equipotential for the pixel regions 100.

According to embodiments of the present invention, the photosensitive array includes a plurality of pixel regions arranged in rows and columns in the substrate and substrate tap regions scattered among the pixel regions. Each of the pixel regions corresponds to one of the substrate tap regions, and the substrate of the pixel region continues with the substrate of the corresponding substrate tap region. The substrate tap region provides a voltage application location for the substrate of the corresponding pixel regions. The multiple columns of pixel regions include sets of two adjacent columns in which the charge readout regions of each column directly face the charge readout regions of the other column while the photosensitive regions of each column are separated from the photosensitive regions of the other column by the charge readout regions. Additionally, each such set of two adjacent columns includes subsets of four pixel regions belonging to two adjacent rows and corresponding to one of the substrate tap regions. Further, the four pixel regions surround the corresponding substrate tap region so that the surrounded substrate tap region provides a voltage application location for all the four pixel regions. The arrangement of the substrate tap regions makes it easier to apply a voltage to the substrate of the pixel regions and allows the applied voltage to create an equipotential environment in the substrate for the four pixel regions surrounding the substrate tap region. Coupled with the substrate leads, the arrangement with the substrate tap regions for voltage application to the substrate allows pixels in the photosensitive array to operate in an equipotential environment in the substrate. Further, compared to the design with each pixel region being provided with an individual substrate tap region, it allows easier fabrication of pixels with a reduced size. Furthermore, the through trench isolations are arranged in the substrate so as to laterally extend therein to separate and isolate adjacent pixel regions, and gaps are left between the through trench isolations, where the substrate of each pixel region continues with the substrate of the corresponding substrate tap region. This design provides a desirable substrate isolation effect for the pixel regions and mitigates cross-talk between different pixels.

Embodiments of the present invention also relate to an imaging apparatus including the photosensitive array as described above. The imaging apparatus may be an apparatus incorporating the above photosensitive array and having imaging capabilities. For example, the imaging apparatus may be an image sensor incorporating the above photosensitive array. In addition to the photosensitive array, the imaging apparatus may further include a data processing unit and/or image output unit, which cooperate(s) with the photosensitive array to process data related to photoinduced charge carriers captured by pixels in the photosensitive array and to form an image. As described above, the photosensitive array is associated with mitigated inter-pixel cross-talk and can create an equipotential environment in the substrate for various pixels therein. MOS capacitors and readout transistors in the photosensitive array are capable of light sensing, and pixels in the photosensitive array are allowed to have a reduced size. Therefore, the imaging apparatus can provide good photosensitive and imaging performance.

It is to be noted that the embodiments disclosed herein are described in a progressive manner with the description of each embodiment focusing on its differences from others. Reference can be made between the embodiments for their identical or similar parts as appropriate.

While the invention has been described above with reference to several preferred embodiments, it is not intended to be limited to these embodiments in any way. In light of the teachings hereinabove, any person of skill in the art may make various possible variations and changes to the disclosed embodiments without departing from the scope of the invention. Accordingly, any and all such simple variations, equivalent alternatives and modifications made to the foregoing embodiments without departing from the scope of the invention are intended to fall within the scope thereof.

What is claimed is:

1. A photosensitive array, comprising:
a substrate defining a plurality of pixel regions arranged in rows and columns and substrate tap regions scattered among the pixel regions, each pixel region comprising a photosensitive region for accommodating a MOS capacitor and a charge readout region for accommodating a readout transistor, each pixel region corresponding to one of the substrate tap regions, the substrate of the pixel region continuing with the substrate of the corresponding substrate tap region, the substrate tap region providing a voltage application location for the substrate of the corresponding pixel region, wherein the columns include sets of two adjacent columns, in each of which sets the charge readout regions of each column directly face the charge readout regions of the other column while the photosensitive regions of each column are separated from the photosensitive regions of the other column by the charge readout regions, and each of which sets includes subsets of four pixel regions belonging to two adjacent ones of the rows and surrounding a corresponding one of the substrate tap regions; and
isolation structures disposed in the substrate, the isolation structures including through trench isolations extending through the substrate along a thickness direction thereof, the through trench isolations extending laterally within the substrate to isolate adjacent pixel regions, the substrate of each pixel region continuing with the substrate of the corresponding substrate tap regions.

2. The photosensitive array of claim 1, wherein the isolation structures include first and second isolations, which extend into the substrate from upper and lower surfaces thereof, respectively, terminate in the substrate, and extend laterally within the substrate, and wherein at least some of the through trench isolations are each made of one of the first isolations and one of the second isolations that is vertically joined to the first isolation.

3. The photosensitive array of claim 2, wherein the first isolations isolate the photosensitive regions of the pixel regions from the charge readout regions thereof and isolate the pixel regions from the corresponding substrate tap regions.

4. The photosensitive array of claim 2, wherein the second isolations isolate adjacent ones of the pixel regions in such a manner that the substrate of the isolated pixel regions is discontinuous at the second isolations.

5. The photosensitive array of claim 1, wherein the substrate tap regions are arranged between the columns in each set of two adjacent columns of pixel regions, and wherein each of the substrate tap regions corresponds to, and is surrounded by, four pixel regions belonging to two adjacent rows, or at least one of the substrate tap regions is each disposed between, and corresponds to, two pixel regions belonging to one row so as to provide a voltage application location for the substrate of the two pixel regions.

6. The photosensitive array of claim 5, wherein in each set of two adjacent columns of pixel regions, the substrate tap regions are arranged in line with the charge readout regions of the two columns along a column-wise direction of the pixel regions between the photosensitive regions of the two columns.

7. The photosensitive array of claim 6, wherein the columns of pixel regions include a plurality of subsets of pixel regions belonging to two adjacent columns, which are arranged side by side along a row-wise direction of the pixel regions, and wherein the substrate tap regions scattered among the columns of pixel regions are arranged in rows and columns.

8. The photosensitive array of claim 7, further comprising a plurality of substrate leads on the substrate, each extending above a respective row of substrate tap regions and coming into electrical connection with the substrate via the row of substrate tap regions.

9. The photosensitive array of claim 5, wherein some of the through trench isolations form closed rings encircling the respective substrate tap regions and the corresponding pixel regions, rest of the through trench isolations are arranged within the closed rings to isolate adjacent ones of the pixel regions, and the substrate of the pixel regions continues with the substrate of the corresponding substrate tap regions.

10. The photosensitive array of claim 5, wherein each set of two adjacent columns includes a plurality of subsets of pixel regions belonging to two adjacent rows, in each of which subsets, the two pixel regions of each column correspond to two different ones of the substrate tap regions and share a common charge readout region, and wherein some of the through trench isolations form open rings encircling the respective substrate tap regions and the corresponding pixel regions and being open at the common charge readout regions, rest of the through trench isolations are arranged within the open rings to isolate adjacent ones of the pixel regions, and the substrate of the pixel regions continues with the substrate of the corresponding substrate tap regions.

11. The photosensitive array of claim 1, wherein the charge readout region of each pixel region includes a source accommodating region and a drain accommodating region, and wherein the photosensitive array further comprises source and drain regions formed in the substrate in the respective source and drain accommodating regions.

12. The photosensitive array of claim 11, wherein the source accommodating regions are arranged into a plurality of rows, and wherein the photosensitive array further comprises a plurality of source lines on the substrate, each extending over a respective row of source accommodating regions and coming into electrical connection with a respective row of source regions.

13. The photosensitive array of claim 11, further comprising a plurality of drain lines on the substrate, each extending over a respective column of pixel regions and coming into electrical connection with a respective column of drain regions.

14. The photosensitive array of claim 1, further comprising gate structures arranged on the substrate of the respective pixel regions, each gate structure spanning over the photosensitive and charge readout regions of a respective one of the pixel regions, each gate structure comprising, stacked sequentially from bottom upward, a gate oxide layer, a floating gate, an inter-gate dielectric layer and a control gate, and wherein the MOS capacitor comprising the gate structure and the substrate of the photosensitive region, and the readout transistor comprises the gate structure and the source and drain regions of the charge readout region.

15. The photosensitive array of claim 14, further comprising a plurality of control gate lines on the substrate, each crossing the photosensitive regions and charge readout regions of a respective row of pixel regions so as to serve as the control gates of the gate structures in the same row.

16. An imaging apparatus, comprising the photosensitive array as defined in claim 1.

* * * * *